United States Patent [19]
Lebaschi

[11] Patent Number: 5,764,485
[45] Date of Patent: Jun. 9, 1998

[54] MULTI-LAYER PCB BLOCKADE-VIA PAD-CONNECTION

[76] Inventor: Ali Lebaschi, 4158 (190 65) Decoro St., San Diego, Calif. 92122

[21] Appl. No.: 635,080

[22] Filed: Apr. 19, 1996

[51] Int. Cl.$^6$ ....................................... H05K 7/02
[52] U.S. Cl. .................. 361/774; 361/760; 361/807; 361/808; 361/777; 257/773; 257/774; 257/779; 257/737; 257/738; 228/180.21; 228/180.22; 174/263; 174/255; 174/261; 174/262; 174/266
[58] Field of Search ...................... 361/774, 748, 361/784, 760, 807, 808, 765, 777; 257/773, 774, 775, 779, 781, 737, 738, 713; 228/180.22, 180.21; 174/255, 261, 262, 181, 266, 263, 264

[56] References Cited

U.S. PATENT DOCUMENTS

| | | | |
|---|---|---|---|
| 4,349,862 | 9/1982 | Bajorek et al. | 361/762 |
| 4,511,757 | 4/1985 | Ors et al. | 174/68.5 |
| 5,133,495 | 7/1992 | Angulas et al. | 228/180.1 |
| 5,227,013 | 7/1993 | Kumar | 156/644 |
| 5,275,330 | 1/1994 | Isaacs et al. | 228/180.2 |
| 5,400,220 | 3/1995 | Swamy | 361/760 |
| 5,571,593 | 11/1996 | Arldt et al. | 428/131 |
| 5,637,832 | 6/1997 | Danner | 174/260 |
| 5,637,920 | 6/1997 | Loo | 257/700 |
| 5,640,047 | 6/1997 | Nakashima | 257/738 |
| 5,640,048 | 6/1997 | Selna | 257/738 |

OTHER PUBLICATIONS

Applicant's Prior PTO/Disclosure Document #390,635/filed 22 Feb. 1996.

*Primary Examiner*—Leo P. Picard
*Assistant Examiner*—David Foster

[57] ABSTRACT

A special so called BLOCKADE-Via™ apparatus and technique for more efficient circuiting and assembly of electronic components on a multilayer parallel-conductivity "printed-circuit board" employing high-density conductor-pins and solder-ball construction. A BGA(ball-grid array) component may be placed upon pads employing a array of special blocked-vias, thereby enabling any given ML/PCB design to option other circuit-path routings from each individual via pad. A special via cap is set forth, which may be employed in combination with a special occluding lower-layer of the ML/PCB substrate. Thus, additional discrete circuiting may also be installed upon the opposite side of the ML/PCB, an advantageous function facilitating assembly of two or more parallel-layered circuits, whereby former offset open-vias can be eliminated by employment of a special array of vias drilled to selective depths vertically-aligned directly below the BGA pads for example. Volume assembly processing of this special ML/PCB is easily handled by existing production-facility equipment and procedures;— the resulting blocked-vias being less critical to make, exhibit superior conductivity, while offering approximately 30% greater via density (or conversely, ML/PCB area-reduction). The disclosure also features a special high-efficiency hexagonally shaped via-pad having honeycomb interstitial spacing; as well as a special crisscrossed via-pad for improved electrical flow.

19 Claims, 1 Drawing Sheet

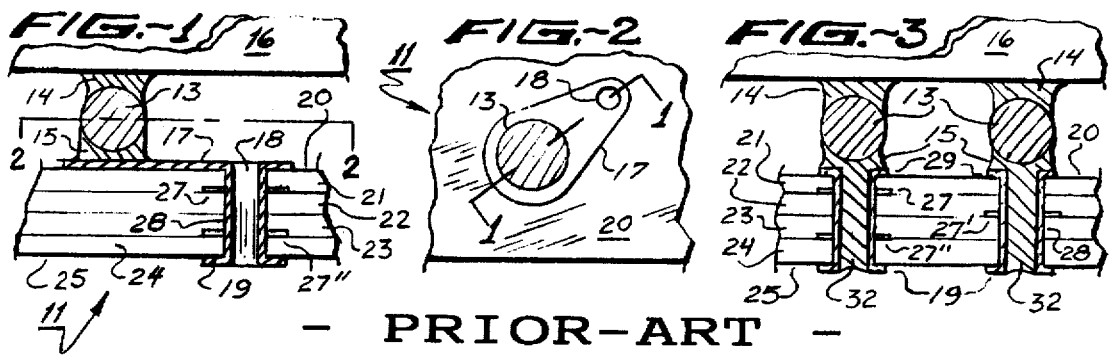
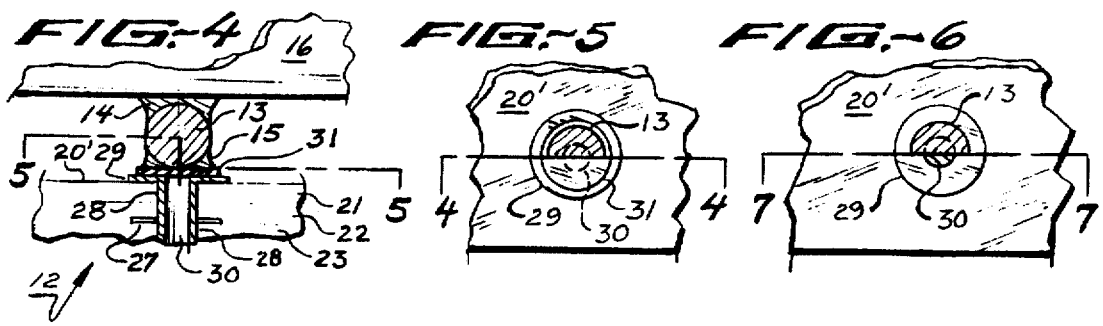
– PRIOR-ART –
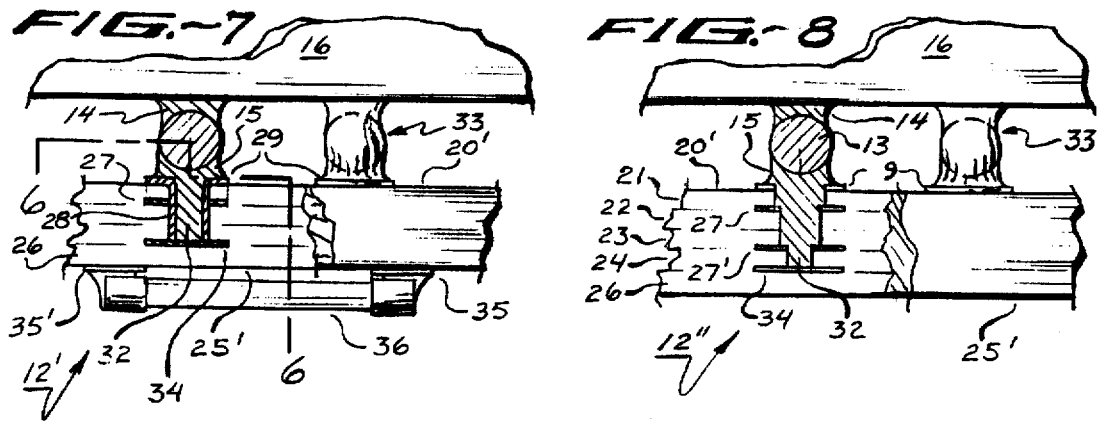
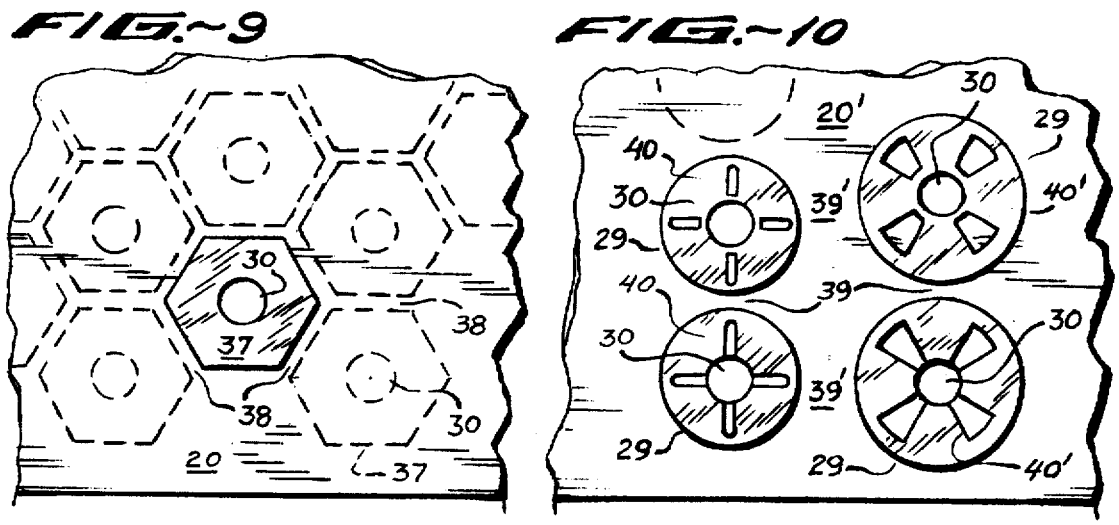

MULTI-LAYER PCB BLOCKADE-VIA PAD-CONNECTION

FIELD OF THE INVENTION

This invention relates in general to methods of connecting IC's(integrated-circuits) and other electrical-components which employ solder-balls to make connection with the ML/PCB(multi-layer printed-circuit board); and, in which one or more so called conductive vias are formed into a layered substrate. Such vias thereby electrically interconnect with so called conductive pads and associated conductive traces formed upon surfaces of the layered substrate, and in connection with solder-ball pads formed upon the outer surface of the substrate. In the art, electronic components such as a micro-processor, FPGA(field-programable gate array), or a micro-controller, are placed upon the PCB, or more aptly an ML/PCB, and are able to establish conductivity throughout all the pads. The technique also relates to use any type electronic package using solder-ball connection, such as BGA(ball-grid array), and Flip-chip.

BACKGROUND OF RELEVANT EARLIER INVENTION

Owing to the passion of electronics manufacturers to push electronics design of IC's toward achieving ever higher densities of external chip connections, a trend to employ a type of electrical connection device using solder-ball connection, is increasing in popularity as compared to other heretofore standard IC-packaging configurations having problematical hair like leads extending from their tiny package. This trend of continuously trying to pack more circuitry conductors into smaller space is now often pressing today's manufacturing technology to the limit, in so far as cost-effective spatial packaging techniques are concerned.

An IC-package employs one more IC-chips (semiconductor units upon which electrically conductive circuitry are formed) which are mounted on the top surface of a dielectric planar multi-layered substrate. Here, electrical connection to conductive material not part of the IC-package, such as a PCB, is made through convenient use of an array of solder-balls positioned on a surface to which any chip is attached relative to the outer surface of the substrate. Passive components (resistors, capacitors, etc.) can also be mounted on the top-surface of the multi-surface laminated substrate, whereby electrically conductive discrete traces and pad regions are facilitated upon each layer of the substrate in a manner suiting the particular electrical function.

Many component manufactures are shifting their component design into such surface-mount packages, the ease of assembly and providing more pin-connections, gives the surface-mount components certain advantage over the through-hole components. The surface-mount component uses only a single layer of the board for connection, that thus leaves all the other layers more surface for electrical trace routing. During recent years, most high-end components such as micro-processors and FPGA have become smaller yet faster, giving manufactures to pack more functionality into the same basic package. In order to take full advantage of these improvements, data and address lines are increased to transfer the larger amount of data in a shorter period of time. For example, the currently advanced micro-processors can support 64-bits of data-transfer, thus requiring 128-lines is just enough to handle input/output and address-lines.

In addition to these lines, most micro-processors are embedded with features such as serial-communication, more interrupt lines, DMA-transfer, etc. The standard high-density QFP(quad flat-pack)-packages are about 240-280 pins, which is barely enough to support a 64-bit processor, and requires a new high-resolution assembly robot to place these components on the board. The assembly process necessitated a final human supervision via electronic-magnification, so as to watch for any conductive cross-over bridges between the pins. Since the final part tends to be pricey, manufactures are trying to update their equipment regularly to assure high quality-control for their services.

The next generation of the 128-bit micro-processor is requiring still more pin connections, well beyond 280-QFP package capability; the latest BGA package offering more I/O-pin(input/output) connections within reduced area, thereby gaining acceptance as the package of choice for many applications. The BGA technique can handle 400 connections, at the same package size as the 280-QFP; however, considering it's high-density chip carrier boards with more trace widths, inter-trace space widths, and vias interconnecting the different layers, must now somehow become even smaller.

There are several PCB(to herein be generally regarded as multi-layer type) ways to design routes in BGA packaging, one method being to place a via next to each pin-connection point, enabling each pin to be accessed from any layer of the board. However, these vias need to be very tiny in order to fit a via next to each pin, yet without bridging a connection to neighboring pins. Also, all traces within each layer of the component has to be very narrow in order to cross by vias an their pads. Because of the high-density of traces and the accurate positioning of the vias, these PCB's tend to be very costly, while assembly of these parts requires the same problematical accuracy as the hi-density QFP-packages. One of the major challanges facing vendors making via diameters smaller than 6-mills, is the limit of the presently preferred Mechanical-drilling process, which exhibits less positioning accuracy as compared to Laser-drilling. Where practical (1-mill via drillings are to delicate, subject to brakage), Mechanical-drilling is still actually preferred over Laser-drilling, owing to absence of thermal-distortion of the preferred lower-cost organic polymer based ML/PCB (offering superior dielectric quality over inorganic substrates) imposed by $CO^2$ or Nd:YAG thermal-lasers, which penetrate by heating the substrate material,—producing melting, burning, and evaporation. Problematical side effects of Thermal-lasers is evidenced in dielectric degradation, charing, and surface reflow distortions; thus, a non-thermal laser such as a Excimer-laser, is preferably employed when forming vias in organic based substrate material, which may include aramid-fiber reinforcement. Patterned-masks(such as of copper or chromium on glass) are also employed during Laser-drilling procedure, enabling substantially simultaneous drilling for a given drill-depth. The scanning laser is tuned to a frequency ablatively removing only the substrate material. Hence, the proper laser-fluence (combination of duration and intensity of application), enables penetration through the substrate, but discretely not through the pads;—permitting a via to be made downwardly occluded as though by a mechanical-drill of limited stroke-length (but mechanical-drilling is not material selective). Another alternate drilling procedure into an inorganic substrate material, is by means of anisotropic dry reactive ion-etching (which avoids the isotropic undercutting characteristic of wet chemical etchants).

RELATED ART

Background research discovery provides only some recent prior patent-art regarded as germane to this disclosure, chronologically for example, in U.S. Pat. No. 4,511,757(filed: July 1983 to AT&T) was shown an early use of an electroplated via (no solder-ball use) between two layers (or more) of special insulative material in a disclosure entitled: "Circuit-board Fabrication Leading to Increased Capacity".

In U.S. Pat. Nos. 5,133,495 & 5,203,075 (both filed: August 1991 to IBM), is shown a "Method Of Bonding Flexible-circuit To Circuitized-substrate To Provide Electrical-connection Therebetween", wherein is shown an early example using a solder-ball connection between two inter-conductive pads, which technique can be applied to make a connection between a component using a solder-ball and a ML/PCB pad. This means of inter-connection between pads does not solve the problem of more densely routing the ML/PCB, as shall be elsewhere herein.

In U.S. Pat. No. 5,227,013(filed: July 1991 to M&CT) is disclosed a method for "Forming Via Holes In A Multilevel Substrate In A single-step", involving use of a dielectric substrate into which via holes are placed to differing depths according to electrical traces buried in the layered substrate, whereupon conductive medium is filled into the vias for subsequent interconnection to surface mounted IC-chips. However, the patent does not contemplate employ the technology of installing an electronic-component using a solder-ball to make connection with a ML/PCB pad.

In U.S. Pat. No. 5,275,330(filed: April 1993 to IBM), is disclosed a "Solder-ball Connect Pad-on-via Assembly Process", wherein metal-plated through-hole (non-occluded) vias only are filled with solder for subsequent connection to a solder-ball equipped electronic-module. However, the technique set forth does not contemplate the potential advantageous circuit routeability, nor the separate posterior-surface component mounting provisions, as shall be disclosed herein.

In U.S. Pat. No. 5,355,283(filed: April 1993 to AE of Japan), is shown a "Ball-grid Array w/Via Interconnection", suitable for wirebonding, TAB(tape-automated bonding), or flip-chip connection. Traces to which the IC is mounted are applied upon the top-surface of the substrate wafer, while vias are provided enabling interconnection to BGA solder-balls included upon the trace-pads of the opposite bottom-surface of the wafer substrate material. The completed package may then be electrically connected to a PCB by simply reflowing the bottom located solder-balls to aligned pads of the PCB. While not contemplated, this apparatus could be improved by taking advantage of using a multilayer interconnection and adopting the special blockade-via technique hereof to attain greater routability from solder-ball to the die-chip bond-wires.

In U.S. Pat. No. 5,400,220(filed: May 1994 by Dell Corp.) shows a "mechanical ML/PCB and ball-grid array interconnect apparatus", which herein represents a currently popular method of using a through-hole via to make a connection between the solder-ball and a ML/PCB.

Therefore, in full consideration of the preceding patent review, there is determined a need for an improved form of device to which these patents have been largely addressed. The instant inventor hereof believes their newly improved ML/PCB device, commercially referred to as the BLOCKADE-VIA™, currently being developed in conjunction with a 20×20-BGA for prototyping purposes; which art exhibits certain advantages as shall be revealed in the subsequent portion of this instant disclosure.

SUMMARY OF THE INVENTION

A.) In view of the foregoing discussion about the earlier invention art, it is therefore important to make it pellucid to others interested in the art that the object of this new parallel-conductivity BLOCKADE-VIA™ ML/PCB technique is to provide the shortest route of conductivity between the ML/PCB and an electrical component employing solder-balls with vias aligned vertically directly thereunder. These vias may be made to variously determined drill-depths according to circuitry design parameters. The term parallel-conductivity simply refering to the multi-layering of electrical-circuits, one below the other, within the stratified substrate levels of the planar-wafers.

Generally, these special vias are preferably made blocked (occluded) by presence of at least the lowest layer of the ML/PCB substrate material. Accordingly, this configuration accomodates ready anterior(top)-surface mounting of components, and for a given circuit facilitating need for fewer vias, and involving lower density of their associated electrical traces. While this new blockade-via ML/PCB can be compatibly combined with conventional offset-via construction, it really serves to obviate need of conventional through-hole vias at each electrical circuit trace-pad; thus ideally, the blockade-via embodiment is best employed exclusively, without presence of conventional offset-vias.

The new via arrangement uses the electronic-component's solder-ball in concentric-alignment (coaxially) with anterior via-pad and with the via hole, thereby extending directly down into the lower layers of the ML/PCB in order to establish conductivity with a particular circuit, rather than employ use of a non-direct conventional offset-via.

B.) Another object of this invention disclosure is to set forth a plural or ML/PCB with special blockade-via feature; wherein is exemplified an anterior-surface BGA arrangement, each solder-ball of which being concentrically-aligned discretely over their respective via pad to a layer depth preferably not entering the lower-layer; thereby enabling convenient optional installation of still other electronic components discretely (separately) upon the opposite lower-layer side. The construction and production utilization of this special blockade-via ML/PCB requires only ordinary currently popular lower-cost manufacturing procedures for implementation; whereby for example, conventional mechanical-drilling employing more reliable 6–10 mill via diameters (as compared to smaller drill sizes) can be implemented, while still advantageously accommodating a substantial increase in component pin density.

Furthermore, as future demands for density of circuitry increase, this new blockade-via ML/PCB can readily employ state-of-the-art Laser-drilling techniques advantageously as well, thereby still providing the same relative spatial pin-density gains over conventional ML/PCB's (some of which have been reviewed herein in the preceding patent-art background discussion). Also, the pads and vias can be copper-plated very easily, by means of standard existing coppering process as today's conventionally standard process; while over-coppering of the board is more easily avoided. Each via is preferably only drilled to a depth essentially determined by the designer's layered circuiting interconnection needs.

C.) Another object of this invention disclosure is to set forth a ML/PCB article wherein by virtue of shorter routing of circuitry through vertically direct placement of the BGA solder-balls upon the via-pad, significantly improved conductivity to the component pins is achieved. Plus, spatial clearances surrounding via-pads is increased upon the ML/PCB's anterior-surface, enabling electrical traces to be routed passed via-pads with more freedom; and, the traces can be made to greater widths (currently 8-mill or greater), allowing higher electrical-current flow even in high pin-density embodiments. The blockade-via ML/PCB circuitry is thus to be more directly routed (speeding circuit response-time), liberating mid-layers(interior) of substrate from excessive or circuitous trace path routing, for increased data routability.

Moreover, owing to this special ultra-efficient electrical ML/PCB configuration, a solder-ball electronic-component attachment having ultimately shortened pin to via hole configuration, offers an approximate 30%-increase in BGA density; which can thus even more easily accomodate conventional spatial considerations, where a BGA is located upon via-pads arranged offset from their actual via-holes.

D.) Another object of this invention disclosure is to set forth a blockade-via ML/PCB article wherein the via hole can be simply filled-in with solder only(no copper required) for conductivity down among the mid-layer trace-pads; thereby at the option of the manufacturer, eliminating the more involved via-wall coppering-process. The via wall can still be conventionally "step-drilled", that is, descending to progressively smaller hole-diameters as each mid-layer interior-pad is transcended (passed), either by means of known Mechanical-drilling or Laser-drilling procedures. The substantially conventional stepping arrangement as usual serving to provide greater annular solder-surface exposure, thereby making contact (electrical communication) with any mid-layer pad more predictable.

Still another advantage of the blockade-via ML/PCB resides in elimination of need to resort to more costly so-called "burned" via implementation, sometimes required in conventional ML/PCB's, where isolated circuits are sometimes otherwise inaccessibly buried within the substrate.

DESCRIPTION OF THE PREFERRED EMBODIMENT DRAWINGS

The foregoing and still other objects of this invention will become fully apparent, along with various advantages and features of novelty residing in the present embodiments, from study of the following description of the variant generic species embodiments and study of the ensuing description of these embodiments. Wherein indica of reference are shown to match related matter stated in the text, as well as the Claims section annexed hereto; and accordingly, a better understanding of the invention and the variant uses is intended, by reference to the drawings, which are considered as primarily exemplary and not to be therefore construed as restrictive in nature; wherein:

FIG. 1, is a cross-sectional side-elevation view of a ML/PCB, showing prior-art construction of solder-ball pad with an adjacent via;

FIG. 2, plan-view thereof, showing offset relationship of via and pad;

FIG. 3, cross-sectional side-elevation view of a ML/PCB, showing prior-art construction of solder-ball pad aligned over through-hole via;

FIG. 4, cross-sectional side-elevation view of a ML/PCB, revealing the new capped/blind-via invention art construction by way of comparison to the preceding illustrations;

FIG. 5, plan-view thereof, showing special concentric relationship of via and pad;

FIG. 6, cross-sectional side-elevation view of a ML/PCB, revealing the new bottom/blind-via invention art construction by way of comparison to the preceding illustrations;

FIG. 7, plan-view thereof, showing the special concentric relationship of via and pad;

FIG. 8, cross-sectional side/elevation-view, revealing the invention employing stepped-via construction;

FIG. 9, plan-view of a PCB showing special hexagonal-pads centered over vias;

FIG. 10, plan-view of a PCB showing special crisscross-relief pads centered over vias.

ITEMIZED NOMENCLATURE REFERENCES

11/11'—overall prior-art structures
12/12'12"—overall new-art structural generic-variants
13—solder-ball
14—outward solder-joint
15—inward solder-joint
16—exemplified component
17—offset-pad
18—offset open-via
19—open posterior-pad
20—ML/PCB's anterior-surface
21—ML/PCB's 1st-layer (top-layer)
22—ML/PCB's 2nd-layer
23—ML/PCB's 3rd-layer
24—ML/PCB's 4th-layer,
25/25'—ML/PCB's posterior-surface (conventional/special)
26—MLJPCB's occluding lower-layer
27/27'/27"—ML/PCB's interior-pads
28—conductive-wall
29/29'—concentric-pads (upper/lower)
30—unfilled occluded-via
31—occluding via-cap
32—solder-fill
33—overall solder-stanchion
34—interior occluding-pad
35—posterior-pad 38—honeycomb spacing
36—exemplified electronic-component 39—proximal spacing
37—hexagonal-pad 40/40'—crisscross-relief (straight/fanned)

DETAILED DESCRIPTION OF THE PREFERRED EMBODIMENTS

Initial reference is given by way of FIGS. 1 & 2 showing currently popular prior-art (per U.S. Pat. No. 5,400,220), wherein is exhibited a single terminal unit of a typical offset BGA(ball-grid array) type arrangement 11. Exemplified is a conventional solder-ball 13 connected to an outwardly adjoining ordinary electrical-component 16 through usual solder-joint 14; and, similarly connected inwardly through usual solder-joint 15 to ordinary offset-pad 17 extending obliquely from an open-via 18. The inherent problem with this state-of-the-art connection being that it is not spatially efficient, owing to the area required by the offset nature of the via taking up space which could otherwise be utilized more effectively.

In the further prior-art of FIG. 3 is shown a currently more spatially advanced arrangement for solder-ball connectivty 11' (per patent U.S. Pat. No. 5,275,330 by IBM-Corp.); however, the problem remains that there is no provision for, nor contemplation of, discrete mounting of separate componentry upon posterior-surface 25, since that surface is intrinsically littered with an array of solder-filled vias 32, as is clearly and extensively demonstrated in their patent. Also, there are more labor intensive steps involved in making such a via hole filled completely with solder. For example, solder-paste must be deposited several times in order to finally fill-up the via hole; which must be done in order to provide structural solder that ultimately supports the joining 15 to the solder-ball 13.

Moreover, the technique of FIG. 3 shows how the vias extend entirely through the ML/PCB, thereby disadvantageously blocking electrical traces to be routed; hence, posing substantially the same problem of routeability of PGA (pin-grid array) component, and yet not actually taking full advantage of the potential offered by a surface-mount component. Therefore, the only real "real-world" advantage of the FIG. 3 prior-art technique, resides in the ability to drill it's solder-filled 32 via holes to a larger size as compared to FIGS. 1 & 2 technique.

There remain now subtle, however vital other differences which are to become herein more evident and understood as important improvements. For example, FIG. 4 discloses how the new blockade-via technique may be implemented most readily by use of a special occluding via-cap 31, which thereby essentially blocks the via hole, and thereby eliminates the relatively involved procedure of otherwise necessarily filling the via hole 30 with solder before a solid connection is attained between the joining solder-joint 15 and associated via-pad 29. Since in the FIG. 3 prior-art procedure, the molten-solder tends to problematically wick away from solder-ball 13, until the via's hole 30 is filled; while in the new FIGS. 4 & 5 technique, there is no possible tendency toward this production problem fit because there is no wicking action occurring. Note further, that the special conductive cap 31 covered via hole 30 in FIG. 4, is shown projecting down an indeterminant depth, by way of signifying that via 30 may be left entirely open at it's bottom outlet(per FIG. 1), or can be made to terminate blind at some layer level where there are no further interior-pads 27'; thereby leaving the ML/PCB's posterior-surface via free in the manner of FIGS. 7 & 8. This capped arrangement can thus easily provide a hollow via sealed at both ends.

In FIGS. 6 & 7 is disclosed an alternate generic-variant blockade-via embodiment hereof, wherein the via is straight-drilled provided with a conductive-wall 28, and specially occluded at it's lower terminus by means of an interior occluding-pad 34 arranged proximal to special occluding lower-layer 26. In this embodiment, the via hole is uncapped but still with conductive-plating (generally of copper) 28, which for example communicates with interior-pad 27 and interior occluding-pad 34, which is then solder-filled 32 so as to be connected up through otherwise conventional solder-ball stanchion aggregation 33. A further generic-variant embodiment of FIG. 8 reveals how the invention is preferably made when the via is formed without a conductive wall-plating. While FIG. 8 outwardly appears exactly like FIG. 7 (both examples of FIGS. 7 & 8 here communicating with an anterior-pad 29 portion), here only a solder-filling 32 is employed in combination with a stepped-via configuration in order to provide good electrical conduction with impinging interior-pads 27, 27', and an interior occluding-pad 34.

Being that both examples of FIGS. 7 & 8 feature a special occluding lower-layer 26, then it is shown in FIG. 7 how an entirely separate component 36 (here exemplified as perhaps a resistor or capacitor) can be conveniently mounted thereunder upon a pad 35 of a discréte circuit of it's own if desired, owing that the posterior-surface 25' of lower-layer 26 is generally smooth without via pads 19 (FIGS. 1 & 3). There can be an exception to this non-perforated (un-viaed) posterior-surface arrangement however, a generic-variant of this blockade-via invention provides that open posterior via holes of the type shown in FIGS. 1 & 3 may be optionally employed in combination with the special capped blockade-via of FIG. 4. Accordingly, such a ML/PCB embodiment could be made according to this instant invention disclosure, whereby perhaps half the vias might be of a special open posterior-via type blockade-via having it's anterior portion capped per FIG. 4, while the remainder may be configured of the blockade-via type per FIG. 7. Such a blockade-via combination would therefore still provide some non-perforated posterior surface upon which to conveniently install a discrete component according to FIG. 7.

Next, study of FIG. 9 shows a special hexagonally (six-sided) shaped electrical via-pad 37, thus so configured as to facilitate the maximum possible density of via-pads in keeping with maintaining the greatest possible electrical conductivity (electrical-current handling capacity), while interjacent-spaces 38 thus define an ultimately efficient honeycomb spacing pattern. This unique via pad and associated honeycomb spacing combination thereby maximizes the clustered unit number density for a given surface area, while minimizing the interjacent area spacing required; hence, facilitating the greatest number of solder-ball connections possible for a given area. Note that heretofore, via-pads order to attain their greatest possible unit number density, there would be a tendency to position the circular via-pads so close together as to pose the problematical possibility of spurious electrical-current conductively bridging the tangently interjacent spacing of proximal pad edges.

Finally, in FIG. 10 is presented two special alternate circular via-pad shapes 29 and 29', separated by proximal interjacent spaces 39 and more generous interjacent spacing 39', one pad having a straight formed crisscross-relief (non-conductive open-space region) 40 bisecting the via-hole 30. The other pad appears as a preferably slightly larger via-pad 29', featuring a rather fanned shape 40', likewise bisecting an exemplified via-hole 30. The general advantage of such crisscrossed via-pads residing in the reduction of the medial surface-area of the via-pad, thereby serving to provide more even distribution of electrical-current flow.

Thus, it is readily understood how the preferred and generic-variant embodiments of this invention contemplate performing functions in a novel way not heretofore available nor realized. It is implicit that the utility of the foregoing adaptations of this invention are not necessarily dependent upon any prevailing invention patent; and, while the present invention has been well described hereinbefore by way of certain illustrated embodiments, it is to be expected that various changes, alterations, rearrangements, and obvious modifications may be resorted to by those skilled in the art to which it relates, without substantially departing from the implied spirit and scope of the instant invention. Therefore, the invention has been disclosed herein by way of example, and not as imposed limitation, while the appended Claims set out the scope of the invention sought, and are to be construed as broadly as the terminology therein employed permits, reckoning that the invention verily comprehends every use of which it is susceptible. Accordingly, the embodiments of the invention in which an exclusive property or proprietary privilege is claimed, are defined as follows.

What is claimed of proprietary inventive origin is:

1. An apparatus for connecting an electronic component having a plurality of solder-balls, to a ML/PCB having a plurality of plated blockcade-vias, enabling direct alignment of the blockade-via pads with the solder-balls and discrete component installation or routing beneath the blockade-via; said apparatus comprising:

an occluding means by which a plurality of vias in said ML/PCB are made electrically and physically blocked;

said vias drilled to depths determined by circuiting interconnection needs;

discrete concentric-alignment of a via-pad conductively over each said via on the anterior-surface;

discrete concentric-alignment of a solder-ball conductively over each said via-pad.

2. The ML/PCB apparatus according to claim 1, wherein said via drillings are formed in step-drilled fashion.

3. The ML/PCB apparatus according to claim 1, wherein said via drillings are formed in straight-drilled fashion.

4. The ML/PCB apparatus according to claim 2, wherein said substrate is of an organic material.

5. The ML/PCB apparatus according to claim 2, wherein said substrate is of an inorganic material.

6. The ML/PCB apparatus according to claim 2, wherein said vias do not enter the lower-layer, enabling ML/PCB's entire posterior-surface be utilized for mounting of other discrete circuitry.

7. The ML/PCB apparatus according to claim 2, wherein some of said vias do not enter the lower-layer, enabling a portion of ML/PCB's posterior-surface to be utilized for mounting of other discrete circuitry.

8. The ML/PCB apparatus according to claim 2, wherein said via-pad is capped by an occluding disk.

9. The ML/PCB apparatus according to claim 2, wherein said via is filled with a conductive material such as solder.

10. The ML/PCB apparatus according to claim 2, wherein said via's wall is plated with a conductive material such as copper.

11. The ML/PCB apparatus according to claim 2, wherein said via-pad is formed to a circular shape.

12. The ML/PCB apparatus according to claim 2, wherein said via-pad is formed to a special hexagonal shape, thereby maximizing density while minimizing intermediate spacing.

13. The ML/PCB apparatus according to claim 2, wherein said via-pad is centrally formed with a crosscrosss shaped internal spacing configuration, serving to more evenly distribute current flow.

14. An ML/PCB having at least one open top via for connection to a solder-ball, wherein need for solder-filling of via is eliminated; comprising: a conductive cap placed atop said via occluding it's opening while facilitating localized joining of via-pad to solder-ball of electronic-component being mounted thereupon; thereby precluding wicking of molten-solder down into said opening.

15. An ultra-efficient ML/PCB configuration having plural vias centered on conductive pads for connection to an electrical-component's solder-balls; comprising hexagonal shaped pads within interjacent-spaces defining a honeycomb pattern, thereby maximizing the density while minimizing the spacing.

16. The ML/PCB apparatus according to claim 15, wherein the said conductive cap can be made to any desirable thickness.

17. The ML/PCB apparatus according to claim 15, wherein the size of said conductive cap is made larger than the said via and no larger than said via-pad.

18. The ML/PCB apparatus according to claim 2, wherein said vias are formed by conventional drilling procedures such as Mechanical-drilling, Laser-drilling, Etch-drilling.

19. The ML/PCB apparatus according to claim 18, wherein is included discrete routing of electrical-traces upon the posterior-surface, and or within the sublayers of beneath said blocked vias.

* * * * *